US008151232B2

(12) United States Patent
Huang et al.

(10) Patent No.: US 8,151,232 B2
(45) Date of Patent: Apr. 3, 2012

(54) REPEATER DRIVEN ROUTING METHODOLOGY

(75) Inventors: Dajen Huang, Sunnyvale, CA (US); Robert R. Brown, Fremont, CA (US)

(73) Assignee: Oracle America, Inc., Redwood City, CA (US)

(*) Notice: Subject to any disclaimer, the term of this patent is extended or adjusted under 35 U.S.C. 154(b) by 410 days.

(21) Appl. No.: 12/422,028

(22) Filed: Apr. 10, 2009

(65) Prior Publication Data

US 2010/0262945 A1    Oct. 14, 2010

(51) Int. Cl.
G06F 17/50    (2006.01)

(52) U.S. Cl. .......................................... 716/114

(58) Field of Classification Search .................. 716/104, 716/114, 118–119.126, 129–130
See application file for complete search history.

(56) References Cited

U.S. PATENT DOCUMENTS

| | | | | |
|---|---|---|---|---|
| 5,974,245 A * | 10/1999 | Li et al. | ............ | 716/55 |
| 6,532,580 B1 * | 3/2003 | Josephson et al. | ............ | 716/114 |
| 6,601,227 B1 * | 7/2003 | Trimberger | .................. | 716/113 |
| 6,678,871 B2 * | 1/2004 | Takeyama et al. | ............ | 716/114 |
| 6,738,959 B2 * | 5/2004 | Jung et al. | ..................... | 716/114 |
| 6,928,401 B1 * | 8/2005 | Wanek | ............................. | 703/14 |
| 6,944,842 B1 * | 9/2005 | Trimberger | .................. | 716/114 |
| 6,966,045 B2 * | 11/2005 | Otaguro | ........................ | 716/104 |
| 6,996,512 B2 * | 2/2006 | Alpert et al. | ..................... | 703/14 |
| 7,010,767 B2 * | 3/2006 | Elassaad et al. | ............... | 716/114 |
| 7,062,743 B2 * | 6/2006 | Kahng et al. | .................... | 716/122 |
| 7,251,800 B2 * | 7/2007 | McElvain et al. | ............. | 716/112 |
| 7,257,791 B2 * | 8/2007 | Galatenko et al. | ............ | 716/114 |
| 7,412,680 B1 * | 8/2008 | Gouterman et al. | .......... | 716/126 |
| 7,441,208 B1 * | 10/2008 | Padalia et al. | ................... | 716/129 |
| 7,487,488 B1 * | 2/2009 | Huang et al. | ................... | 716/130 |
| 2002/0184607 A1 * | 12/2002 | Alpert et al. | ..................... | 716/15 |
| 2004/0221253 A1 * | 11/2004 | Imper et al. | ..................... | 716/13 |
| 2006/0112364 A1 * | 5/2006 | Alpert et al. | ..................... | 716/10 |
| 2007/0168900 A1 * | 7/2007 | Carney et al. | .................... | 716/13 |
| 2008/0016479 A1 * | 1/2008 | Alpert et al. | ..................... | 716/6 |
| 2008/0072202 A1 * | 3/2008 | Alpert et al. | ..................... | 716/13 |
| 2008/0168411 A1 * | 7/2008 | Mang et al. | ....................... | 716/6 |
| 2009/0013299 A1 * | 1/2009 | Alpert et al. | ..................... | 716/13 |
| 2009/0031269 A1 * | 1/2009 | Chen et al. | ........................ | 716/9 |
| 2009/0172622 A1 * | 7/2009 | Pyapali et al. | .................... | 716/8 |
| 2009/0319977 A1 * | 12/2009 | Saxena et al. | ................... | 716/13 |
| 2010/0213982 A1 * | 8/2010 | Teig et al. | ........................ | 326/93 |

* cited by examiner

*Primary Examiner* — Stacy Whitmore

(74) *Attorney, Agent, or Firm* — Osha•Liang LLP

(57) ABSTRACT

A method for routing a chip, involving forming a plurality of nets configured to connect components of the chip, wherein each of the plurality of nets is included in a netlist, assigning at least one repeater to each of the plurality of nets in the netlist, wherein the repeaters are assigned prior to performing physical routing of the plurality of nets, inserting the at least one repeater in a corresponding net, wherein the insertion of the at least one repeater divides the corresponding net into at least two subnets, and performing the physical routing of the plurality of nets by connecting each of the subnets.

11 Claims, 3 Drawing Sheets

REPEATER DRIVEN ROUTING METHODOLOGY

BACKGROUND

Routing is a crucial step in the design of integrated circuits. Routing builds on a preceding step, called placement, which determines the location of each active element of an integrated circuit (IC). Once placement has occurred, then routing, i.e., the process of adding all wires needed to properly connect all of the placed components while obeying all design rules, can occur.

Routers are typically given some pre-existing polygons consisting of pins (also called terminals) on cells, and optionally some pre-existing wiring called pre-routes. Each of these polygons is associated with a net, usually by name or number. The primary task of the router is to create geometries such that all terminals assigned to the same net are connected, no terminals assigned to different nets are connected, and all design rules are obeyed. In addition, to correctly connect the nets, routers are also responsible for ensuring that the design meets timing, has no crosstalk problems, meets any metal density requirements, does not suffer from antenna effects, etc. This long list of often conflicting objectives is what makes chip-level routing extremely difficult.

In chip level routing, the typical process is to route the chip first (i.e., perform an initial routing), insert repeaters (buffers) for wires, i.e., to meet a predefined transition time, and subsequently rip and re-route wires (i.e., perform a second-level routing) to connect various nets with repeaters. Repeater insertion is a technique for reducing the transition time associated with long wire lines in integrated circuits. The technique involves cutting the long wire into two or more short wires and inserting a repeater between each new pair of short wires.

In the initial route, designers often need to topologically control some nets for various reasons. For example, a designer may require routing in a specific way in order to cross or be in proximity with repeater banks for repeater solutions, a bus may need to be routed in a bundle so that timing performance of the bus between different bits is very similar, a multiple fan-out net may require a repeater inserted in a tree structure, and/or a multiple fan-out net may need to be routed in a spine route topology.

In a high performance chip, the number of nets requiring such custom route attention can be significant. Thus, the entire routing process is often time consuming and can easily become the bottleneck of the chip integration process. In some cases, when a chip floor plan is modified at a later stage, all custom routes are re-done.

SUMMARY

In general, in one aspect, the invention relates to a method for routing a chip, comprising forming a plurality of nets configured to connect components of the chip, wherein each of the plurality of nets is included in a netlist, assigning at least one repeater to each of the plurality of nets in the netlist, wherein the repeaters are assigned prior to performing physical routing of the plurality of nets, inserting the at least one repeater in a corresponding net, wherein the insertion of the at least one repeater divides the corresponding net into at least two subnets, and performing the physical routing of the plurality of nets by connecting each of the subnets.

In general, in one aspect, the invention relates to a computer system, comprising a processor, and a memory, wherein instructions stored on a compute readable medium, when executed by the processor, are configured to form a plurality of nets configured to connect components of the chip, wherein each of the plurality of nets is included in a netlist, assign at least one repeater to each of the plurality of nets in the netlist, wherein the repeaters are assigned prior to performing physical routing of the plurality of nets, insert the at least one repeater in a corresponding net, wherein the insertion of the at least one repeater divides the corresponding net into at least two subnets, and perform the physical routing of the plurality of nets by connecting each of the subnets.

Other aspects of the invention will be apparent from the following description and the appended claims.

DETAILED DESCRIPTION

Figure 1:
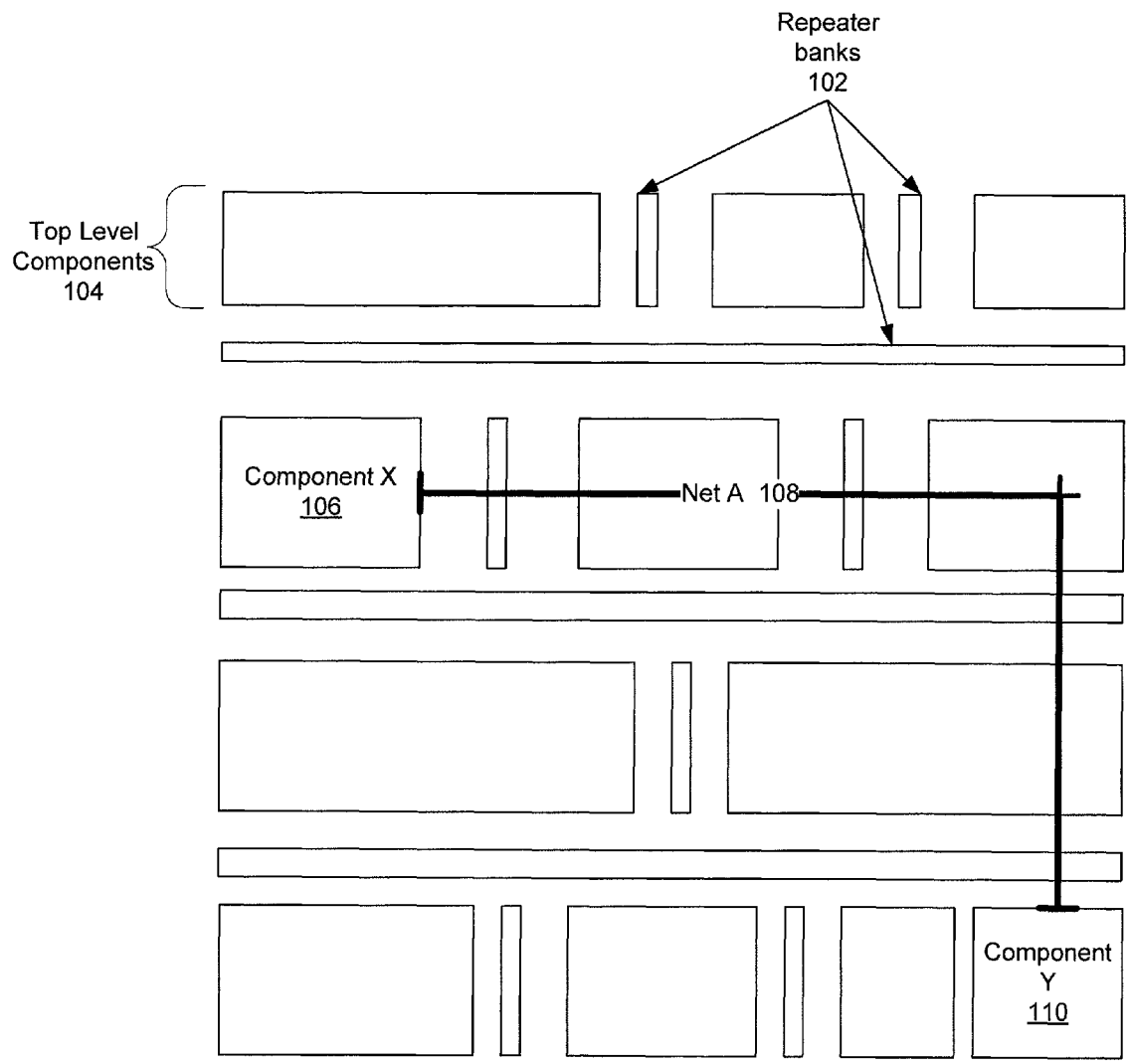
FIG. 1 shows a chip layout in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention provide a method for chip-level routing. Specifically, embodiments of the invention provide a method for chip-level routing that assigns and inserts repeaters to routing nets prior to performing physical routing of chip components.

FIG. 1 shows a partial chip floor plan view with top-level components (104) (or clusters) and repeater banks (102). The components (102, 106, 110) on the chip floor plan may be any device or element that is part of the chip circuitry and has wires that need to be connected (routed) to one or more other components. For example, components may include, but are not limited to, resistors, logic gates, transistors, capacitors, etc. Repeaters are buffers and/or inverters that are used to reduce the transition time associated with long wire lines in integrated circuits. Repeaters effectively divide a single long wire (i.e., a net) into two or more short wires (i.e., subnets), where a repeater is inserted between each new pair of short wires/subnets. A repeater bank (102) may include one or more repeaters.

Continuing with FIG. 1, Net A (108) has a connection from an output of Component X (106) to an input of Component Y (110). Those skilled in the art will appreciate that although Net A (108) is shown as a single net connection, Net A (108) may also represent a multi-bit bus connection. In one or more embodiments of the invention, Net A (108) may be a critical net, i.e., a net that requires a specific topology and/or a net that would typically require custom routing to meet particular timing requirements. Those skilled in the art will appreciate that while FIG. 1 shows only one net (Net A), there are a plurality of nets that connect components in one or more routing layers. That is, nets may also connect wires of component A that is located on a first routing layer to wires of component B located on a second routing layer.

Figure 2:
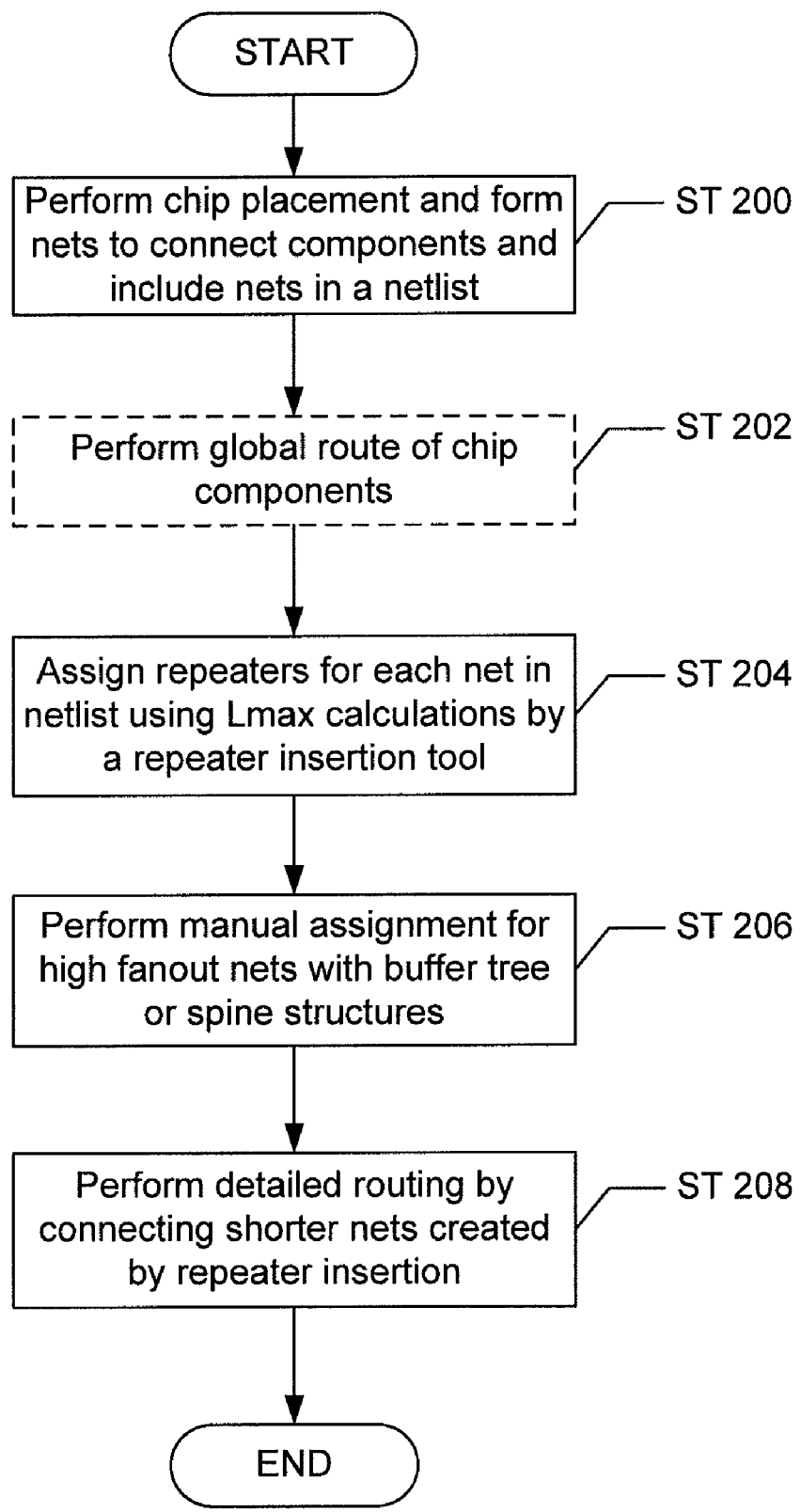
FIG. 2 shows flow chart in accordance with one or more embodiments of the invention.

FIG. 2 shows a flow chart for performing a method of routing a chip in accordance with one or more embodiments of the invention. Initially, components are placed on a chip floor plan (ST 200). Chip placement also includes forming nets for connection. The nets formed are included in a netlist. Subsequently, an optional step of performing a global route using an automated routing software tool is performed (ST 202). A global route may help designers in completing routing nets and assigning repeaters to formed nets.

At this stage, in one or more embodiments of the invention, repeaters are assigned for each net in the netlist (ST 204). More specifically, in one or more embodiments of the invention, repeaters are assigned based on a computed value of a maximum routing distance or wire length (Lmax). Lmax is the maximum distance a wire can travel before a repeater is needed to meet a specific transition time. Upon defining parameters such as the routing wire width and spacing (called pitch), the maximum wire length (Lmax) can be calculated. In one or more embodiments of the invention, Lmax may be pre-simulated (i.e., a value for Lmax may be simulated and obtained before the process of FIG. 2 begins). The assigned repeaters are subsequently physically inserted into signal path of each net. The repeater insertion process involves following the routing topology from the source node to the end node for each net and inserting a repeater whenever the traveling wire distance is less or equal to Lmax. A repeater insertion tool (e.g., an Electronic Design Automation software tool) may be used for such repeater insertions during an implementation process. If a global route is performed in ST 202, the repeater insertion tool follows the global route path of each net, between its source and destination nodes, and assigns repeaters so that each segment formed after a repeater is inserted is less than or equal to Lmax. That is, repeaters are inserted prior to performing a physical route of the nets.

Those skilled in the art will appreciate that calculation of Lmax of a wire is performed using known methods and algorithms. Further, those skilled in the art will appreciate that Lmax may be dependent on wire width, spacing (wire class), repeater type, signal routing topology, a required slew-rate of the signal, and/or a combination of the aforementioned parameters. Further, the Lmax value may be decided when a new routing project begins.

Continuing with FIG. 2, after repeaters are inserted, the repeater insertion tool writes out the new netlist that includes the assigned repeaters (not shown). A designer may then perform manual repeater assignment for high fanout nets with e.g., buffer tree or spine structures (ST 206). Finally, a detailed route is performed by designers using the new netlist (ST 208). Specifically, the detailed physical route connects the shorter nets created by repeater insertion. Thus, in the present invention, there may be only one routing task that is performed after repeater insertion.

Using the method of FIG. 2, the present invention achieves routing topology control by inserting repeaters in the netlist prior to physical routing. After repeater insertion, every long net is divided to small segments with, e.g., approximately 2.5 mm routing length in 45 nm technology. For such a short routing length, a router is able to route every net more easily, which facilitates a quicker method to convert the entire route.

Figure 3:
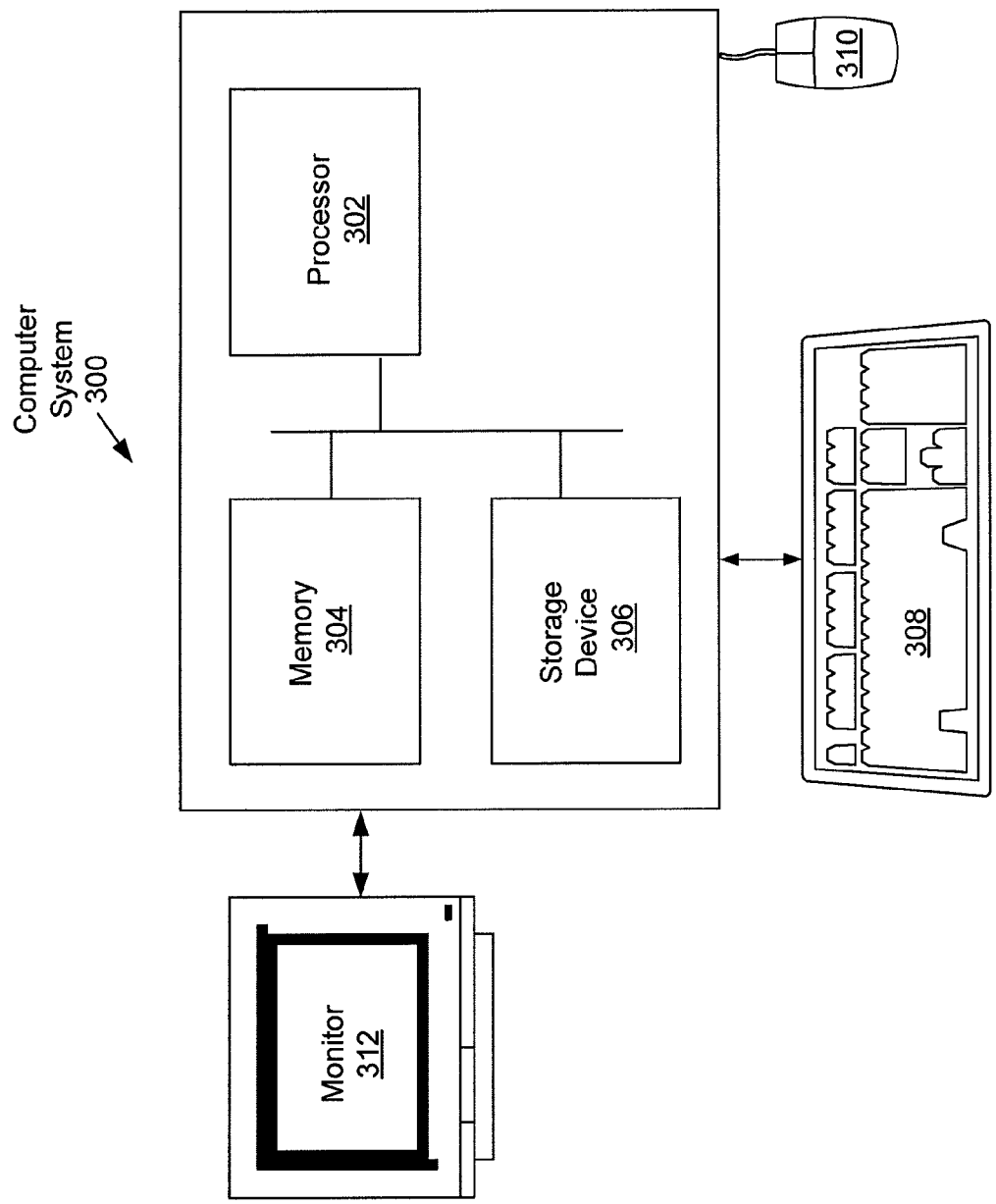
FIG. 3 shows a computer system in accordance with one or more embodiments of the invention.

One or more embodiments of the invention may be implemented on virtually any type of computer regardless of the platform being used. For example, as shown in FIG. 3, a networked computer system (300) includes a processor (302), associated memory (304), a storage device (306), and numerous other elements and functionalities typical of today's computers (not shown). The networked computer (300) may also include input means, such as a keyboard (308) and a mouse (310), and output means, such as a monitor (312). The networked computer system (300) is connected to a local area network (LAN) or a wide area network via a network interface connection (not shown). Those skilled in the art will appreciate that these input and output means may take other forms. Further, those skilled in the art will appreciate that one or more elements of the aforementioned computer (300) may be located at a remote location and connected to the other elements over a network.

The computer system (300) of FIG. 3 may be used to run a software routing tool and/or a software repeater insertion tool. Further, software instructions to perform embodiments of the invention, i.e., instructions for the routing tool and the repeater insertion tool, may be stored on a tangible computer readable medium such as a compact disc (CD), a diskette, a tape, or any other tangible computer readable storage device.

Embodiments of the invention provide an efficient method for performing chip-level routing that reverses the typical routing order. Specifically, embodiments of the invention describe a method for routing that involves inserting repeaters into the chip layout before beginning the process of routing the wires of the chip. Said another way, embodiments of the invention achieve the routing topology control of particular critical nets that are custom routed by inserting repeaters into the netlist before custom routing the critical nets. Thus, netlist manipulation is used for all custom routes of critical nets.

For example, in the case of a buffer tree or a spine structure topology associated with one or more nets, designers may manually assign repeaters to the net to construct its connectivity as the tree or a spine structure requires. Because repeaters are already inserted prior to routing, there is no concern for the exact routing topology for each net. For example, a net inserted with a buffer tree structure will be routed according to the tree by a router. Said another way, because the repeater insertion is netlist based, routing after repeater insertion is much simply rather than manually routing critical nets to result in a specific topology and then predict how repeaters will be inserted so that the final routing will be correct.

Inserting repeaters first eliminates the need of a router with expensive interactive route features to control routing topology in a chip. The repeater insertion process divides any long nets into small sub-nets. It also builds the required buffer tree or a spine structure by creating the corresponding repeater connectivity. After repeater insertion, the router only needs to route the entire chip according to the new netlist without special considerations. This avoid labor intensive custom routing in a chip design, and converts long routes and special routes into many small segments that any commercial router can handle quickly and easily.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A non-transitory computer readable medium comprising software instructions for performing a method for routing a chip, the method comprising:
   forming, using a processor a plurality of nets configured to connect components of the chip, wherein each of the plurality of nets is included in a netlist;
   assigning, using the processor, at least one repeater to each of the plurality of nets in the netlist, wherein the repeaters are assigned prior to performing physical routing of the plurality of nets, and wherein assigning the at least one repeater comprises:
   determining a maximum routing distance (Lmax) for a routing layer, and
   inserting the at least one repeater when a traveling wire distance in the routing layer is less than or equal to the maximum routing distance (Lmax);
inserting the at least one repeater in a corresponding net, wherein the insertion of the at least one repeater divides the corresponding net into at least two subnets; and
performing the physical routing of the plurality of nets by connecting each of the subnets.

2. The non-transitory computer readable medium of claim 1, the method performed by the software instructions further comprising:
   placing the plurality of components onto a floor plan of the chip.

3. The non-transitory computer readable medium of claim 1, wherein the physical routing and repeater insertion is performed by an automated routing software tool.

4. The non-transitory computer readable medium of claim 1, wherein at least one of the plurality of nets comprises a buffer tree topology.

5. The non-transitory computer readable medium of claim 1, wherein at least one of the plurality of nets comprises a spine structure topology.

6. The non-transitory computer readable medium of claim 1, the method performed by the software instructions further comprising:
   performing a global route of the plurality of nets, wherein the at least one repeater is assigned to each of the plurality of nets based on the global route.

7. The non-transitory computer readable medium of claim 1, wherein the maximum routing distance (Lmax) is a function of a wire width, a wire spacing, and a repeater type.

8. The non-transitory computer readable medium of claim 1, wherein the maximum routing distance is the maximum distance a wire can travel before a repeater is needed to meet a specific transition time.

9. A computer system, comprising:
   a processor; and
   a memory,
   wherein instructions stored on a computer readable medium, when executed by the processor, are configured to:
      form a plurality of nets configured to connect components of the chip, wherein each of the plurality of nets is included in a netlist;
      assign at least one repeater to each of the plurality of nets in the netlist, wherein the repeaters are assigned prior to performing physical routing of the plurality of nets, wherein assigning at least one repeater to each of the plurality of nets comprises:
         determining a maximum routing distance (Lmax) for a routing layer, and
         inserting a repeater when a traveling wire distance in the routing layer is less than or equal to the maximum routing distance (Lmax);
      insert the at least one repeater in a corresponding net, wherein the insertion of the at least one repeater divides the corresponding net into at least two subnets; and
      perform the physical routing of the plurality of nets by connecting each of the subnets.

10. The computer system of claim 9, wherein the maximum routing distance (Lmax) is a function of a wire width, a wire spacing, and a repeater type.

11. The computer system of claim 9, wherein the maximum routing distance is the maximum distance a wire can travel before a repeater is needed to meet a specific transition time.

* * * * *